(12) United States Patent
Jaisimha et al.

(10) Patent No.: US 8,073,412 B2
(45) Date of Patent: Dec. 6, 2011

(54) METHOD FOR AUTOMATIC FREQUENCY RANGE AND STEP SELECTION USING REGION SIGNATURE FOR A DIGITAL AM/FM TUNER

(75) Inventors: Shree Jaisimha, Senoia, GA (US); Mohammad Reza Kanji, Atlanta, GA (US); Tatsuya Fujisawa, Atlanta, GA (US)

(73) Assignee: Panasonic Automotive Systems Company of America, division of Panasonic Coproration of North America, Peachtree City, GA (US)

( * ) Notice: Subject to any disclaimer, the term of this patent is extended or adjusted under 35 U.S.C. 154(b) by 862 days.

(21) Appl. No.: 11/998,380

(22) Filed: Nov. 29, 2007

(65) Prior Publication Data

US 2009/0143035 A1 Jun. 4, 2009

(51) Int. Cl.
 *H04B 1/18* (2006.01)
(52) U.S. Cl. .............. 455/161.1; 455/161.3; 455/179.1; 455/186.1; 455/3.02; 455/150.1; 342/451

(58) Field of Classification Search .............. 455/161.3, 455/456.1, 457, 513, 67.13, 130, 133–135, 455/142, 154.2, 161.1, 166.2, 168.1, 179.1, 455/180.1, 185.1, 186.1, 188.1, 226.1, 226.2, 455/226.3, 277.2, 3.02, 3.06, 404.2, 150.1, 455/154.1, 158.1; 342/386, 450–451
See application file for complete search history.

(56) References Cited

U.S. PATENT DOCUMENTS

| | | | | |
|---|---|---|---|---|
| 5,654,719 | A | * | 8/1997 | Kunii ............................ 342/451 |
| 6,064,339 | A | * | 5/2000 | Wax et al. ..................... 342/417 |
| 6,351,500 | B2 | * | 2/2002 | Kumar .......................... 375/270 |
| 2002/0009132 | A1 | | 1/2002 | Miller |
| 2002/0183059 | A1 | * | 12/2002 | Noreen et al. ................ 455/427 |
| 2004/0203885 | A1 | * | 10/2004 | Quaid ......................... 455/456.1 |
| 2006/0125692 | A1 | | 6/2006 | Wang et al. |
| 2008/0122695 | A1 | * | 5/2008 | Wang et al. ................... 342/451 |

* cited by examiner

*Primary Examiner* — Pablo Tran
(74) *Attorney, Agent, or Firm* — Laurence S. Roach

(57) ABSTRACT

A method of configuring a tuner includes scanning at least one range of radio frequencies, measuring a signal quality metric for each of a plurality of the frequencies, and selecting a set of operational frequencies for the tuner. The selecting step is dependent upon the measuring step.

20 Claims, 19 Drawing Sheets

FM Band (MHz)

| Region | lower limit | upper limit | Step |
|---|---|---|---|
| ECE | 87.5 | 108.0 | 0.1 |
| USA | 87.7 | 107.9 | 0.2 |
| Canada | 87.7 | 107.9 | 0.2 |
| South America | 87.5 | 108.0 | 0.1 |
| Australia | 87.5 | 108.0 | 0.1 |
| Rest of the World (RoW) | 87.5 | 108.0 | 0.1 |
| Japan | 76.0 | 90.0 | 0.1 |

FIG. 1A

AM Band (KHz)

| Region | lower limit | upper limit | Step |
|---|---|---|---|
| ECE | 531 | 1620 | 9 |
| USA | 530 | 1710 | 10 |
| Canada | 530 | 1710 | 10 |
| South America | 530 | 1710 | 5 |
| Australia | 531 | 1701 | 9 |
| Rest of the World (RoW) | 531 | 1602 | 9 |
| Japan | 522 | 1629 | 9 |

FIG. 1B

| Region | Regional Signature Trait |
|---|---|
| USA/Canada/Mexico | FM Frequency Range from 87.7 MHz to 107.9 MHz, frequency step is 200 kHz. |
| Europe/RoW | FM Frequency Range from 87.5 MHz to 108.0 MHz, frequency step is 100 kHz. C-CQUAM AM stereo exists in certain countries like France, Ireland and Italy under certain frequencies. |
| Japan | FM Frequency Range from 76.0 to 90.0 MHz, frequency step is 100 kHz, AM has stereo channels. JPN supports C-QUAM AM Stereo under certain frequencies. |

FIG. 3

| Region | Frequency Range | Frequency Spacing | C-QUAM AM Stereo | RDS or RBDS |
|---|---|---|---|---|
| US, Canada, Mexico | 87.7 to 107.9 MHz | 200 kHz / odd frequencies | Yes on select frequencies | Select stations have RBDS with extended country code information |
| Europe | 87.5 to 108.0 MHz | 100 kHz / odd and even frequencies | Yes on select frequencies In France, Italy and Ireland only | Majority of stations have RDS with extended country code information |
| Japan | 76.0 to 90.0 MHz | 100 kHz / odd and even frequencies | Yes on select frequencies | No RDS and No RBDS |

FIG. 4

| Algorithm Stage | Action | Time Taken | Upper Bound, Cumulative Time |
|---|---|---|---|
| FM Bandscan Level 1 | FM Bandscan involves scanning the frequency range of 108.0 to 87.5 MHz assessing signal strength, ultrasonic noise and multipath. Each scan on a frequency requires 7ms. | ((108−87.5) + 1)/0.1) = 206 frequencies. Each frequency scan takes 100ms. This adds up to 20600/1000 = 20.6 seconds | 22 seconds |
| FM Bandscan Analysis / Sorting Stage | If we have more than 11 frequencies with Quality > 6, based on data gathered, find out if frequency separation is even or odd or both. A check for even frequencies is done by doing a modulo 2 operation to check if the frequency in MHz is a multiple of 2, meaning if it is divisible by 2. | N.A | N.A |
| FM RDS/RBDS Synchronization Check | Perform RDS/RBDS synchronization check | 1.5 * 11 = 16.5 seconds | 16.5+22=38.5 seconds |
| AM Bandscan First Pass | Perform AM Bandscan from 530 kHz to 1602 kHz with frequency step of 5 kHz | (1602−530/5)*100 ms = 21.44 seconds | 22 seconds + 38.5 = 60.5 seconds |
| AM Bandscan Second Pass | Perform AM Bandscan from 531 kHz to 1602 kHz with frequency step of 9 kHz. | (1602−531/9)*100ms = 11.9 seconds | 12 seconds + 60.5 = 72.5 seconds |

FIG. 6

| Configuration | Action | Speed |
|---|---|---|
| Dual Tuner with foreground scan | Main tuner starts from lower frequency range and scans up subtuner starts from outer range of frequency and scans down. Audio will be muted during scan. | Fastest among configurations |
| Dual Tuner with background scan | Main tuner stays locked onto listening tuner while subtuner performs background scan of entire frequency range. | Same as single tuner but advantage is that audio is not muted during scan |
| Single Tuner with foreground scan | Single tuner performs bandscan across entire range. | Same as case for dual tuner with background scan but audio is muted during scan |

FIG. 10

| | Initialization | OFF | FM Reset | FM Normal | FM Seek | FM Fast | FM Autostore | AM Reset | AM Normal | AM Seek | AM Fast | AM Autostore |
|---|---|---|---|---|---|---|---|---|---|---|---|---|
| SYSTEM ON | | | | | | | | | | | | |
| SYSTEM OFF | | | | | | | | | | | | |
| SEEK | | | | | | | | | | | | |
| SEEKCANCEL | | | | | | | | | | | | |
| FAST | | | | | | | | | | | | |
| TUNE | | | | | | | | | | | | |

STATES (i.e., FUNCTIONS)

EVENTS (i.e., USER INTERFACE CONTROLS)

FIG. 13

METHOD FOR AUTOMATIC FREQUENCY RANGE AND STEP SELECTION USING REGION SIGNATURE FOR A DIGITAL AM/FM TUNER

BACKGROUND OF THE INVENTION

1. Field of the Invention

The present invention relates to a method of configuring a radio including a digital AM/FM tuner, and, more particularly, to a method of configuring a radio including a digital AM/FM tuner for a particular tuner region of the world.

2. Description of the Related Art

With transportation of people and things around the world becoming increasingly easier and inexpensive, it is becoming more necessary to build smart devices that are able to automatically detect and adjust to the changing environment. Conventional digital AM/FM tuners cannot be taken from one part of the world to another because the different tuner frequencies, and different spacing between frequencies, used in different tuner regions of the world. That is, because a tuner is designed to operate with a certain set of frequencies, the tuner may be useless if taken out of the particular tuner region for which the tuner was configured.

Referring to FIG. 1a, in the FM band, North America (encompassing USA, Canada and Mexico) utilizes the frequency range of 87.7 to 107.9 MHz; Japan utilizes the frequency range of 76.0 to 90.0 MHz; and Europe along with the rest of the world (RoW) use the frequency range of 87.5 to 108.0 MHz for FM broadcasting. In the AM band (FIG. 1b), there is more commonality in the utilized frequency range, but the frequency differences or steps between adjacent frequencies vary widely across the globe. North America utilizes a 10 kHz frequency step; South America utilizes a 5 kHz step; and the rest of the world (RoW) utilizes a 9 kHz step.

Consumer electronics digital radio tuners include different versions of software depending upon which tuner region the radio is intended for. The selection of the version of tuner region software may be performed through a factory defined calibration during the manufacturing process. The software that tailors the tuner to a particular tuner region involves setting up the operational frequency range, the frequency step between adjacent frequencies, and other predefined variables to ensure proper operation.

Currently the end user would have to go to an automobile dealership or in order to have the radio configured to the appropriate tuner region. Likewise, second-hand foreign automobiles imported to Japan require importers to often fit a "converter" to down-convert the 87.5 to 107.9 MHz or 87.7 to 107.9 MHz band to the frequencies that the radio is configured to accept (76 to 90 MHz). Although this method works to an extent, there are disadvantages that can result in poor reception. The converter "compresses" the frequencies making the stations appear closer together.

Another radio convention or standard that differs between regions of the world is the use of Radio Data System (RDS) and Radio Broadcast Data System (RBDS). RDS is a standard from the European Broadcasting Union for sending small amounts of digital information using conventional FM radio broadcasts. The RDS system standardizes the transmission format of several types of information, such as the time of day and identification of the track, artist and radio station. RBDS is the United States version of RDS.

Yet another problem is that the functions required of the controls on the user interface, i.e., the Human Machine Interface (HMI) of the radio are different across the various tuner regions of the world. More particularly, the operations triggered by pressing keys or pushbuttons, rotating knobs or dials, or by spoken commands require different configurations depending upon the conventions of the particular tuner regions. Thus, if a radio is moved from one tuner region to another, the controls of the user interface will not be able to perform the intended functions. In conventional radios, the setting of the tuner region and the HMI is performed through manual calibration, which is typically performed at the end of the assembly line during the manufacturing process.

Accordingly, what is neither anticipated nor obvious in view of the prior art is any method of enabling a tuner to be reconfigured when the tuner is moved from one tuner region of the world to another. What is also neither anticipated nor obvious in view of the prior art is any method of reconfiguring the user interface controls of a radio in correspondence with the conventions of the tuner region in which the tuner is disposed.

SUMMARY OF THE INVENTION

The present invention provides a method of enabling a tuner to automatically detect the tuner region of the world in which the tuner is disposed, and of allowing the user to select a set of operational frequencies for the tuner based on the detected tuner region. The present invention also provides a method of automatically redefining the functions of selected user interface controls to correspond with conventions of the tuner region of the world in which the tuner is disposed.

In one embodiment, the method of the present invention enables the tuner region in which the tuner is disposed to be detected with a percentage confidence level, and an indication of this percentage confidence level is presented to the user. Once the user has selected the tuner region in which the tuner is to be configured to operate, the user interface, i.e., the HMI, of the radio may undergo a reconfiguration of the functions controlled by the HMI. Thus, the HMI may be reconfigured to suit the tuner region in which the radio is disposed. In a particular embodiment, the confidence level associated with the tuner region is used in selecting an appropriate state table matrix that corresponds to the tuner region and that is to be loaded into memory. Upon the user selecting a tuner region, the appropriate state matrix table as per the tuner region definition may be loaded into memory to ensure that the user inputs, which may be triggered via either speech or actuation of a button, key, knob or dial, result in the intended end action.

In one embodiment of the invention, a method of configuring a tuner includes scanning at least one range of radio frequencies, measuring a signal quality metric for each of a plurality of the frequencies, and selecting a set of operational frequencies for the tuner. The selecting step is dependent upon the measuring step.

In another embodiment of the invention, a method of configuring a tuner includes scanning a first range of FM or AM radio frequencies, and measuring a first signal quality metric for each of a plurality of the radio frequencies in the first range. A selected second range of an other of FM radio frequencies and AM radio frequencies is scanned. A second signal quality metric is measured for each of a plurality of the radio frequencies in the second range. A set of operational FM frequencies is selected for the tuner, and a set of operational AM frequencies is selected for the tuner. The set of operational FM frequencies and the set of operational AM frequencies correspond to a radio frequency convention in a particular region of the world. The selection of the set of operational FM and AM frequencies is dependent upon each of the measuring steps.

In yet another embodiment of the invention, a method of configuring a radio includes scanning at least one range of radio frequencies, and measuring a signal quality metric for each of a plurality of the frequencies. A set of operational frequencies is selected for a tuner of the radio. The set of operational frequencies corresponds to a radio frequency convention in a particular region of the world. The selection of the set of operational frequencies is dependent upon the measuring step. At least one function is defined for a corresponding user interface control associated with the radio. The defining of the function is dependent upon the selected set of operational frequencies and/or the corresponding radio frequency convention.

An advantage of the present invention is that the set of operational frequencies used by a radio tuner may be automatically changed in accordance with the conventions and standards of a tuner region into which the radio is moved.

Another advantage is that the user may be given the option to override the automatic selection of an identified tuner region and to manually select another tuner region based on information or objectives that may be known to the user.

Yet another advantage is that the functions of the user interface can be automatically modified in order to suit the tuner region into which the radio is moved.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 1a is a table of FM radio frequencies in particular regions of the world;

FIG. 1b is a table of AM radio frequencies in particular regions of the world;

FIG. 3 is a table of radio frequency signature traits in different regions of the world;

FIG. 4 is another table of radio frequency signature traits in different regions of the world;

FIG. 6 is a table of stages of an algorithm according to one embodiment of a method of the present invention;

FIG. 10 is a table of algorithms for different radio tuner configurations according to one embodiment of a method of the present invention;

FIG. 13 is an exemplary state matrix table that is suitable for use in one embodiment of a method of the present invention.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

The present invention may enable a radio to automatically determine a confidence level for the operational frequency range and frequency step for the tuner region in which the radio is disposed. The present invention may not necessarily determine the country that the radio is presently disposed. Rather, the present invention may automatically determine the proper frequency steps and frequency ranges to thereby enable the radio to increase the number of valid broadcast stations that the tuner may receive.

In one embodiment, the method of the present invention is used in conjunction with a digital signal processor (DSP) that can handle baseband frequency signals coming from a tuner IC that feeds in an IF (Intermediate Frequency) at 10.7 MHz which can demodulate FM, AM and C-QUAM AM Stereo. The DSP may differentiate a C-QUAM station by signaling an AM pilot signal when the station that is tuned to supports C-QUAM, as is the case for FM stereo. The front-end DSP, in addition to demodulating the signal, may perform field strength analysis, multipath and ultrasonic noise determination.

Field strength measurements provide an indication of the quality of signal reception and help determine whether the radio station has good signal coverage in the vicinity of the user. This field strength quality parameter is applicable for both AM and FM modulation signal reception.

Although the signal can have high field strength, it can still be subject to being reflected and/or deflected by trees and tall buildings. The degree of such reflections and/or deflections is a parameter known as "multipath", which affects reception quality. This multipath quality parameter is applicable for both AM and FM modulation signal reception.

Figure 2A:
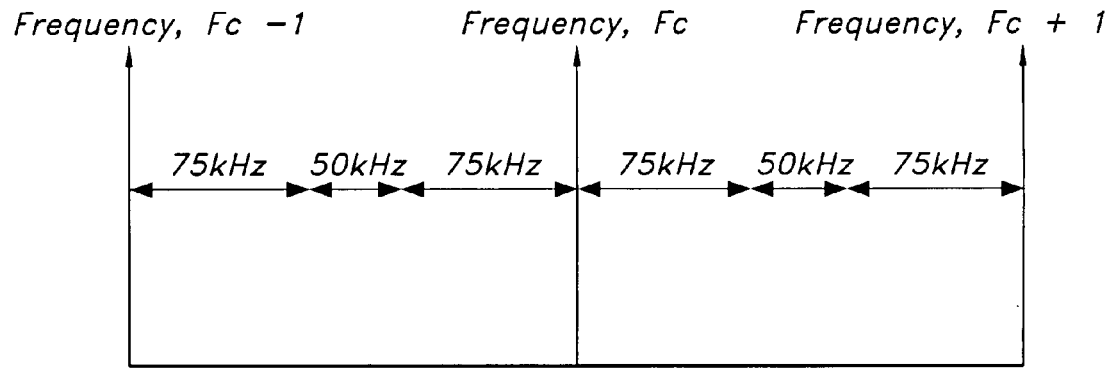
FIG. 2a is a diagram of adjacent FM radio frequencies in the United States tuner region.
Figure 2B:
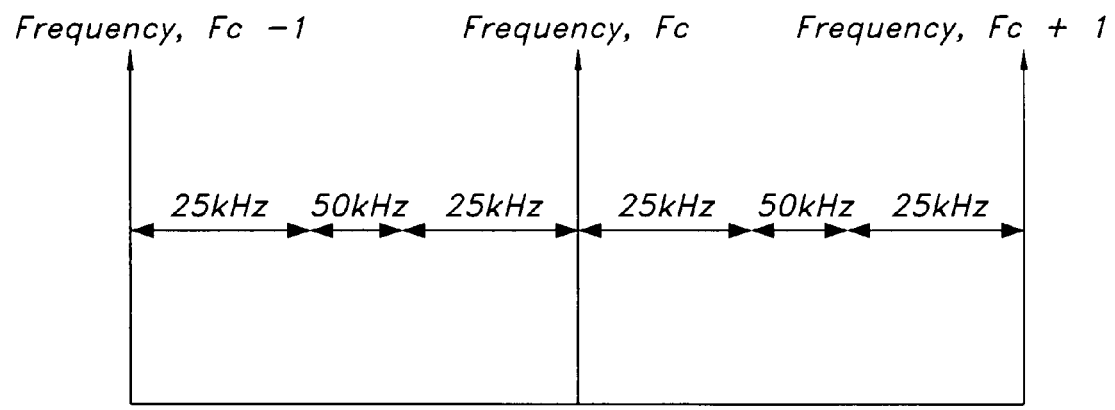
FIG. 2b is a diagram of adjacent FM radio frequencies in the Europe and Japan tuner region.

Radio stations can sometimes overmodulate their signal, leading to adjacent channel interference known as "ultrasonic noise." For example, in the U.S., FM frequencies are spaced apart 200 kHz, as shown in FIG. 2a. There are instances when a radio station overmodulates its signal past the 75 kHz modulation and beyond the allowed 25 kHz guard band, which leads to the station being heard on an adjacent station that is being tuned to. Similarly, in Europe and Japan, FM frequencies are spaced apart 100 kHz, as shown in FIG. 2b. There are instances when a radio station overmodulates its signal past the 25 kHz modulation and beyond the allowed 25 kHz guard band. This quality parameter of ultrasonic noise is applicable for only FM modulation signal reception.

A signal parameter used with AM frequencies is cochannel interference, which is similar in nature to ultrasonic noise as used with FM frequencies. As such, this cochannel interference quality index is applicable for only AM modulation signal reception.

In one embodiment of the present invention, the appropriate FM frequency range and frequency step for the current location of the tuner are determined. After the FM frequency range and step has been determined, then the appropriate frequency range and frequency step for the AM/MW band are determined.

In order to determine the appropriate frequency range and step to be utilized in the FM band, the FM broadcast band may be scanned while measuring the parameters of field strength, multipath, and ultrasonic noise at each scanned frequency. From these three parameters, an overall quality parameter referred to herein as "quality scale" may be formulated for each frequency. The weight given each of the three parameters of field strength, multipath, and ultrasonic noise in the calculation of quality scale may be calibratable, i.e., adjustable, either during manufacture or by the user. As such, the quality output value of quality scale may be based upon a three-dimensional scale involving the three parameters of field strength, multipath, and ultrasonic noise. In one particular embodiment, the quality scale parameter is represented by a number that ranges from 1 to 10, with 10 being the highest quality possible and 1 being a weak signal with poor reception.

One possible reason for taking into consideration the above three parameters, particularly ultrasonic noise, is that overmodulation brought about by some radio stations can lead to adjacent channel interference resulting in "frequency peaks" above a certain threshold that the frequency peaks should not exceed. Such high frequency peaks above the threshold can cause errors in one embodiment of an algorithm of the present invention which identifies the eight strongest frequencies found in the scan of the FM band. Mainly for this reason, frequencies having high ultrasonic noise may need to be discounted in the calculation of the quality scale.

In one embodiment of a method of the present invention, a bandscan is performed across the frequency range of 87.5 MHz to 108.0 MHz with a frequency step of 0.1 MHz, i.e., 100 kHz. A bandscan frequency step of 100 kHz has the advantage of being the largest possible step that may coincide with each of the possible FM frequencies between 87.5 MHz and 108.0 MHz that are in use across the globe, as is evident from FIG. 1a. In one embodiment, the actual bandscan starts at 108.0 MHz and goes backwards to 87.5 MHz.

The method of the present invention may include a recognition process in which the radio performs a bandscan across the frequency range to check whether the measured signature traits within the frequency range match those of a particular tuner region around the world. The regional signature traits in three regions of the world are shown and compared in FIGS. 3 and 4.

In one embodiment, in addition to the other signal quality data gathered during bandscan, one or more tests, which are referred to herein as "range checks", "frequency separation odd/even", and "RDS/RBDS checks", may be performed. The "range checks" test may be based on information gathered from bandscan, and is a check of the range of FM frequencies at which signals of a certain quality level are received. The range of frequencies is one of the tuner region signature traits disclosed in FIGS. 3 and 4.

The frequency separation odd/even test is a determination of whether the FM frequencies at which signals of a certain quality level are received are odd or even. Because adjacent U.S. frequencies are spaced 200 kHz apart, only odd frequencies may be found in the U.S. Conversely, both odd and even frequencies may be found in Japan and Europe due to the 100 kHz step spacing between adjacent frequencies.

The RDS and RBDS check may include waiting to receive a synchronization signal, which characterizes a signal being broadcast utilizing RDS/RBDS. An RDS/RBDS synchronization check may involve staying on a frequency that has a good quality factor for about 1500 milliseconds. If no synchronization signal is received during this time interval, then that frequency may be deemed as a non-RDS/RBDS station.

The RDS and RBDS check may also include attempting to identify a program identification (PI) code and an extended country code (ECC) within the received broadcast signal. The RDS standard provides a mapped out unique identification for each country based on the PI and ECC information embedded in the RDS/RBDS bitstream. This information may enable the radio, once it has received either an RDS or RBDS synchronization signal, to ascertain the country from which the signal is being broadcast. RDS decoding may be performed by the front end DSP or the raw data may be decoded by a micro-controller.

In order to determine the appropriate frequency range and step to be utilized in the AM band, the AM broadcast band may be scanned while measuring the parameters of field strength, multipath, and cochannel interference noise at each scanned frequency. From these three parameters, an AM version of the overall quality parameter of quality scale may be formulated for each frequency. The weight given each of the three parameters of field strength, multipath, and cochannel interference noise in the calculation of quality scale may be calibratable, i.e., adjustable, either during manufacture or by the user. As such, the quality output value of quality scale may be based upon a three-dimensional scale involving the three parameters of field strength, multipath, and cochannel interference noise. In one particular embodiment, the quality scale parameter is represented by a number that ranges from 1 to 10, with 10 being the highest quality possible and 1 being a weak signal with poor reception.

In contrast to the embodiment of the FM bandscan disclosed above, which includes a single scan, one embodiment of the AM bandscan includes two independent scans across the 530 to 1609 kHz bandwidth. The first scan may be in the form of a bandscan with frequency step of 9 kHz, and the second scan may include a bandscan with a 5 kHz frequency step.

The AM bandscan may be particularly useful in identifying the current tuner region due to an overlap in the FM broadcast frequency ranges of Europe, the U.S. and Japan in the 87.5 to 90.0 MHz range. Also, in the FM frequency range of 76.0 to 90.0 MHz (which is the FM broadcast frequency range for Japan) there is overlap with mobile frequencies used in Europe for both civilian and defense sectors. Thus, the AM bandscan and a subsequent C-QUAM check may assist in differentiating between the tuner regions that, due to the overlap, an FM bandscan alone may not be sufficient to differentiate between.

Figure 5:
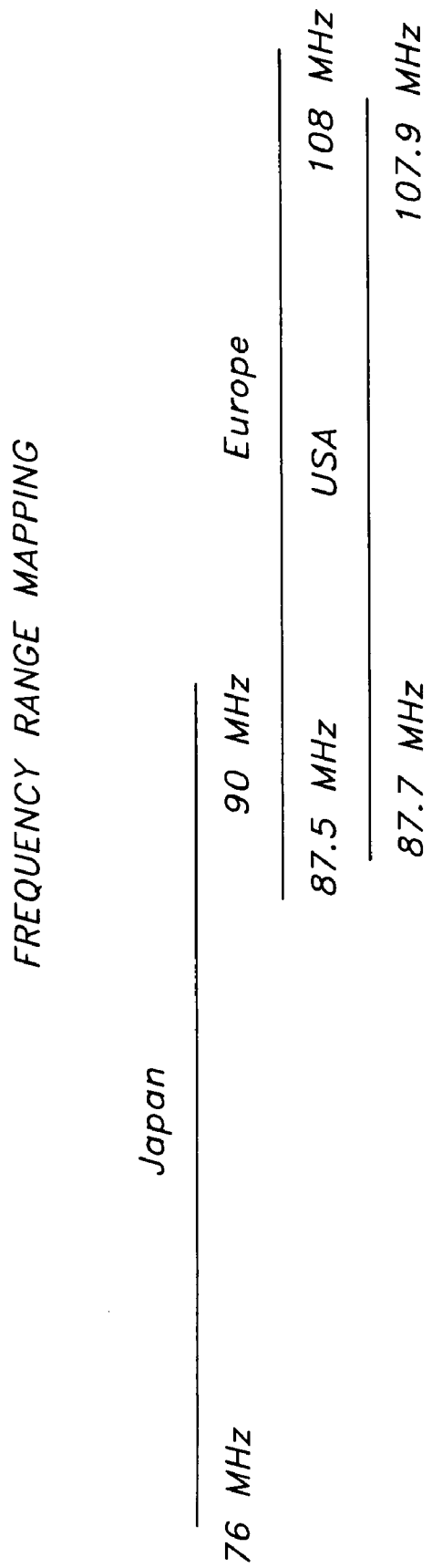
FIG. 5 is a diagram of FM radio frequencies in Japan, Europe, and the United States.

As illustrated in FIG. 5, there is an overlap in the frequency range mapping across the three major FM broadcast bands in the world, namely, the U.S., Europe and Japan, and namely in the 87.5 to 90.0 MHz range. This overlapped range accounts for an overlap of six discrete frequencies if the 100 kHz frequency step is considered, as is used in Europe. Japan also has three or four television stations that broadcast in the FM band between the 87.5 to 108.0 MHz. Thus, there is a total overlap of possibly ten frequencies between Japan, Europe and the U.S. In order to differentiate between these tuner regions despite this overlap of ten frequencies, one embodiment of the method of the present invention attempts to identify at least eleven strong frequencies. In this way, the method of the present invention may include measures to avoid false triggers in the determination of tuner regions, wherein the false triggers may be brought about by the overlapped discrete FM frequencies discussed above. Specifically, the method of the present invention may search for eleven strong frequencies in order to avoid the inconclusiveness that may be caused by the ten FM frequencies that may overlap across the three tuner regions. As between the U.S. and Europe, there are a total of 101 frequencies overlapped in the range from 87.7 to 107.9 MHz.

FIG. 6 is a summary of the stages and time taken by each of the stages in one embodiment of a method of the present invention The FM bandscan analysis/sorting stage includes a check for even or odd frequencies. Even frequencies may be defined as frequencies having an even digit, i.e., 0, 2, 4, 6 or 8, in the tenths of MHz place. Examples are 88.2, 89.0, 94.8, and 96.6 MHz. Odd frequencies may be defined as frequencies having an odd digit, i.e., 1, 3, 5, 7 or 9, in the tenths of MHz place. Examples are 88.7, 91.3, 94.5, and 89.9 MHz.

Figure 7:
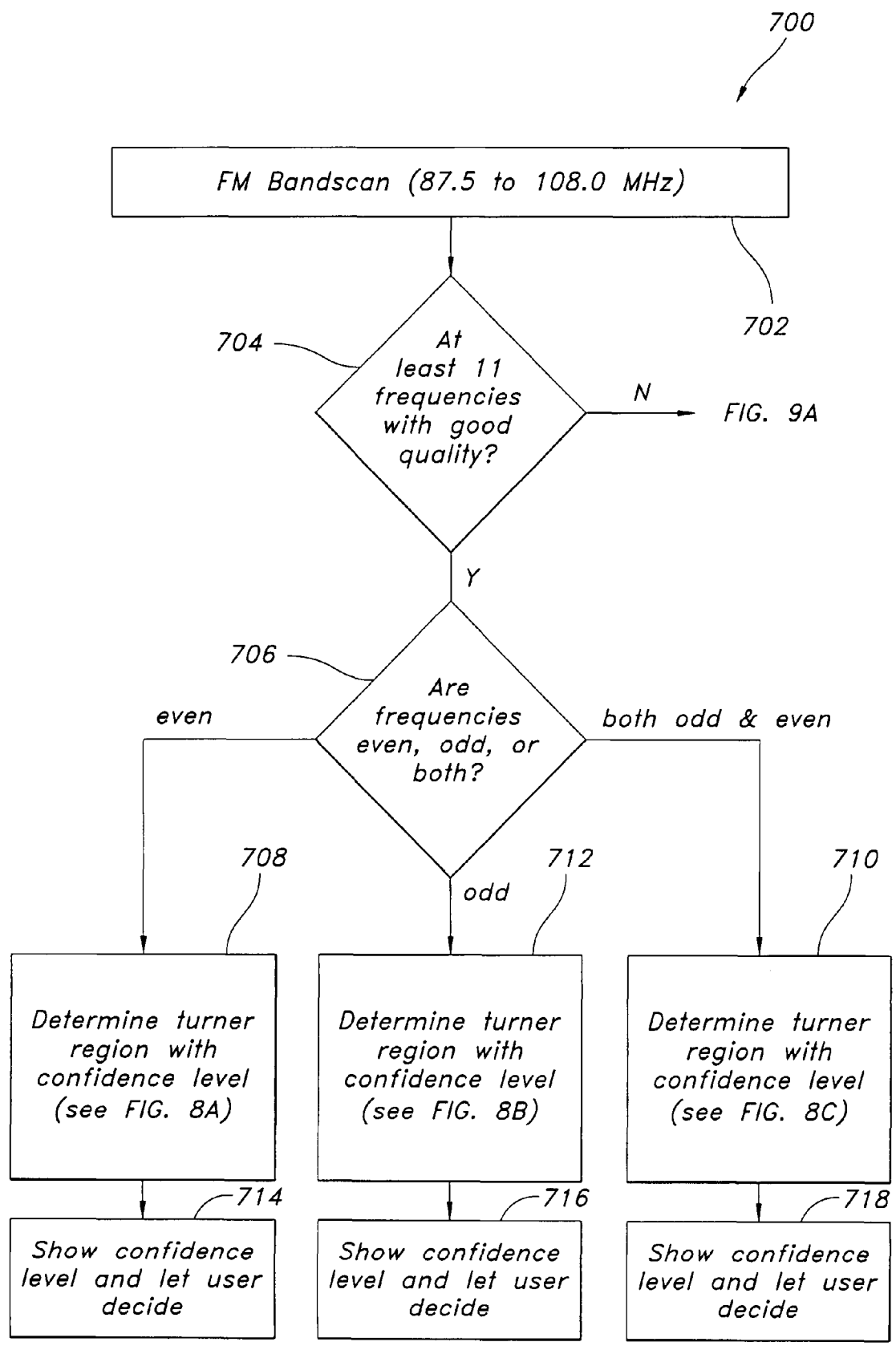
FIG. 7 is a flow chart illustrating the selection of operational FM frequencies for a tuner when at least eleven scanned frequencies have a signal quality metric exceeding a threshold value according to one embodiment of the present invention.

FIG. 7 is a flow chart illustrating one embodiment of a method 700 of the present invention. In a first step 702, an FM bandscan is performed from 87.5 MHz to 108.0 MHz. In step 704 it is determined whether at least eleven frequencies having good signal quality were found in the bandscan. If not, operation continues with a method 900 illustrated in FIG. 9. If at least eleven frequencies having good signal quality were found in the bandscan, then it is determined in step 706 whether the frequencies having good signal quality are even, odd or both, i.e., some frequencies being odd and some frequencies being even.

Figure 8A:
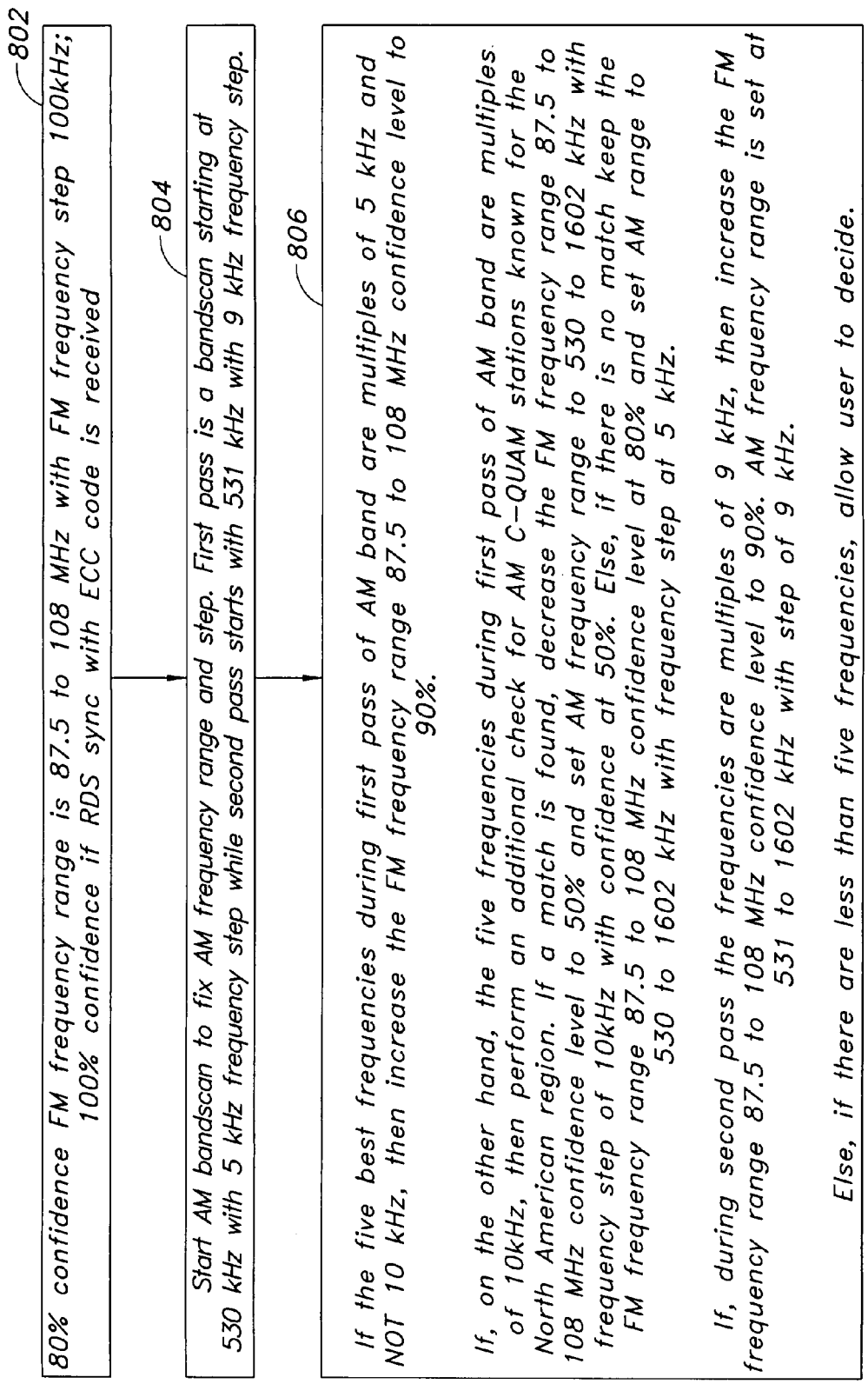
FIG. 8a is a flow chart illustrating the details of determining confidence levels in the operational FM frequencies selected in FIG. 7 when scanned frequencies having a signal quality metric exceeding a threshold value end in even numbers.

In the event that the eleven or more frequencies having measured qualities above a certain threshold are all even or are both even and odd, then operation proceeds to step 708 or step 710, respectively. The details of steps 708, 710 are shown in FIGS. 8*a* and 8*c*, respectively. As shown in steps 802 and 822 of FIGS. 8*a* and 8*c*, respectively there is an 80% confidence level that the tuner is in a tuner region having an FM frequency range of 87.5 to 108.0 MHz and a step of 0.1 MHz, such as Europe, South America or Australia, for example. The confidence level of 80% as well as other confidence levels provided herein have been arbitrarily chosen solely for exemplary purposes to illustrate the method of the present invention, and have not been empirically determined. It is, however, within the scope of the invention for the confidence levels to be empirically determined and/or calibratable at the manufacturing factory and/or by the user.

As further disclosed in steps 802, 822, this confidence level can increase to 100% certainty if either an RDS or RBDS synchronization signal with PI code and ECC country code is received. If an RDS or RDBS synchronization with ECC code is received, then operation continues and an AM bandscan is performed in order to determine the frequency step and frequency range of the AM band.

If an RDS or RBDS synchronization signal with PI code and ECC country code is not received, and there is 80% certainty of the FM frequency range, bandscan in the AM frequency band is performed. The AM frequency bandscan may be in the form of a two-pass scan. The first pass scan may have a frequency step of 5 kHz starting from 530 to 1602 kHz, and the second pass scan may have a 9 kHz frequency step across the 531 to 1602 kHz range (steps 804, 824). The frequencies in both scans may be sorted and the five strongest signals may be identified.

If the five strongest AM signals of the first pass have frequencies that are multiples of 5 kHz and NOT 10 kHz, then the confidence level of the FM frequency range 87.5 to 108 MHz may be increased to 90% (steps 806, 826). The confidence level of the AM frequency range 530 to 1602 kHz with step of 5 kHz may be set at 80%.

If the five strongest AM stations of second pass are multiples of 9 kHz, then the confidence level of the FM frequency range 87.5 to 108 MHz may be increased to 90%. The confidence level of the AM frequency range 531 to 1602 kHz with step of 5 kHz may be set at 80%.

If, on the other hand, the five strongest AM stations are multiples of 10 kHz, then a check may be performed for AM C-QUAM stereo stations that are known to be in the U.S., Canada or Mexico. If there is a match, then the FM frequency range 87.5 to 108.0 MHz confidence level may be decreased to 50%, the FM frequency range 87.7 to 107.9 MHz confidence level may be increased to 50%, and the confidence level for AM frequency range of 530 kHz to 1602 kHz with frequency step of 10 kHz may be set to 50%. If five signals of acceptable quality are not found, then the confidence level may be kept the same and the user may be allowed to manually select the tuner region.

Figure 8B:
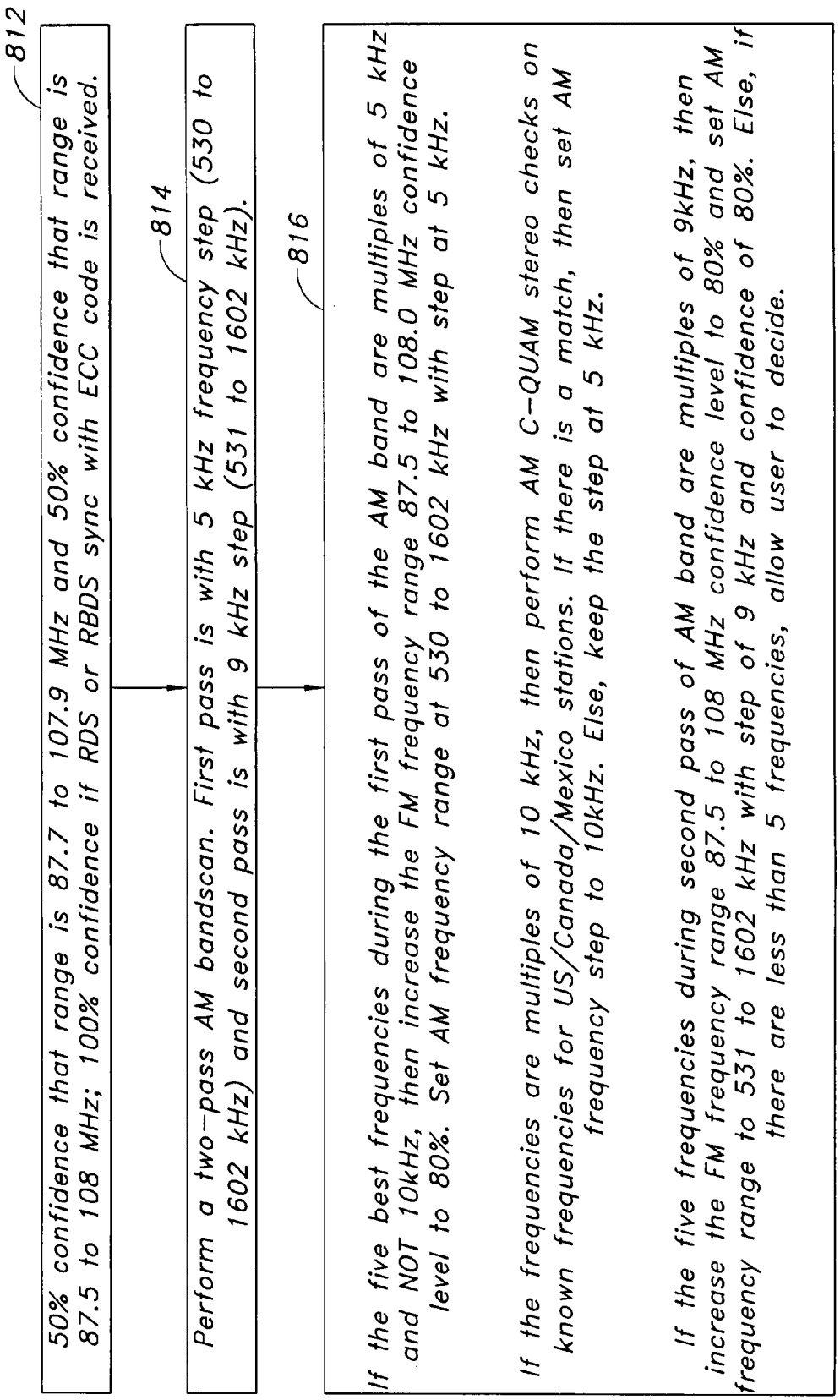
FIG. 8b is a flow chart illustrating the details of determining confidence levels in the operational FM frequencies selected in FIG. 7 when scanned frequencies having a signal quality metric exceeding a threshold value end in odd numbers.
Figure 8C:
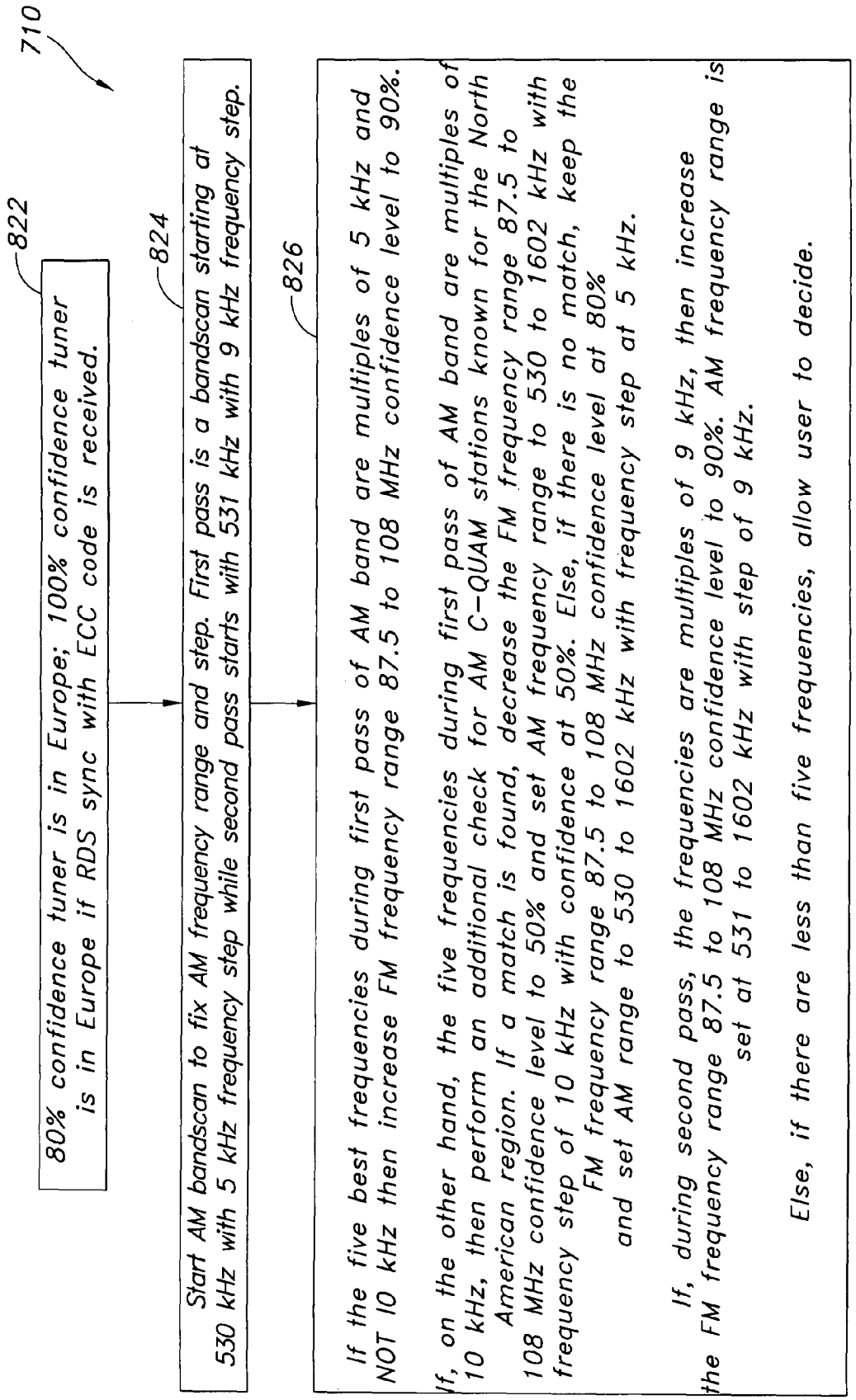
FIG. 8c is a flow chart illustrating the details of determining confidence levels in the operational FM frequencies selected in FIG. 7 when scanned frequencies having a signal quality metric exceeding a threshold value end in both even and odd numbers.

If all of the eleven or more frequencies above the quality index are odd, then operation proceeds to step 712, the details of which are shown in FIG. 8*b*. There is a 50% confidence level in the 87.5 to 108 MHz FM frequency range and a 50% confidence level in the 87.7 to 107.9 MHz FM frequency range (step 812). The confidence level may increase to 100% certainty if either an RDS or an RBDS synchronization with PI code and ECC country code is received.

Next, a bandscan may be performed in the AM frequency range of 530 to 1602 kHz with frequency step of 5 kHz and in the AM frequency range of 531 to 1602 kHz with frequency step of 9 kHz (step 814). This bandscan may include a two-pass scan, the first being with frequency step of 5 kHz, and the second being with a 9 kHz frequency step. The frequencies in both scans are sorted and the frequencies with the five strongest signals may be identified.

If the five strongest AM signals have frequencies that are multiples of 5 kHz and NOT 10 kHz, then the confidence level of FM frequency range from 87.5 to 108.0 MHz may be increased to 80%, and an AM frequency range of 531 to 1602 kHz with step of 5 kHz and confidence level of 80% may be set (step 816). If the five strongest AM signals have frequencies that are multiples of 9 kHz, then the confidence level of FM frequency range from 87.5 to 108.0 MHz may be increased to 80%, and an AM frequency range of 531 to 1602 kHz with step of 9 kHz and confidence level of 80% may be set.

If the five strongest AM frequencies are multiples of 10 kHz, then a check may be performed for AM C-QUAM stations that are known to be in the U.S., Canada or Mexico.

If there is a match for possible U.S. C-QUAM stations, then the confidence level of FM frequency range from 87.7 to 107.9 MHz may be increased to 80%. The AM frequency range may then be set at 530 to 1602 kHz with a frequency step of 5 kHz. If less than five AM frequencies with acceptable quality are found, then the user is allowed to manually select the tuner region. Regardless of whether the eleven or more FM frequencies of minimum signal quality are determined to be odd, even or both in step 706, the user may be shown the confidence level and may be allowed to select the tuner region, possibly overriding the tuner region that the radio has determined to be most likely (steps 714, 716, 718).

Figure 9A:
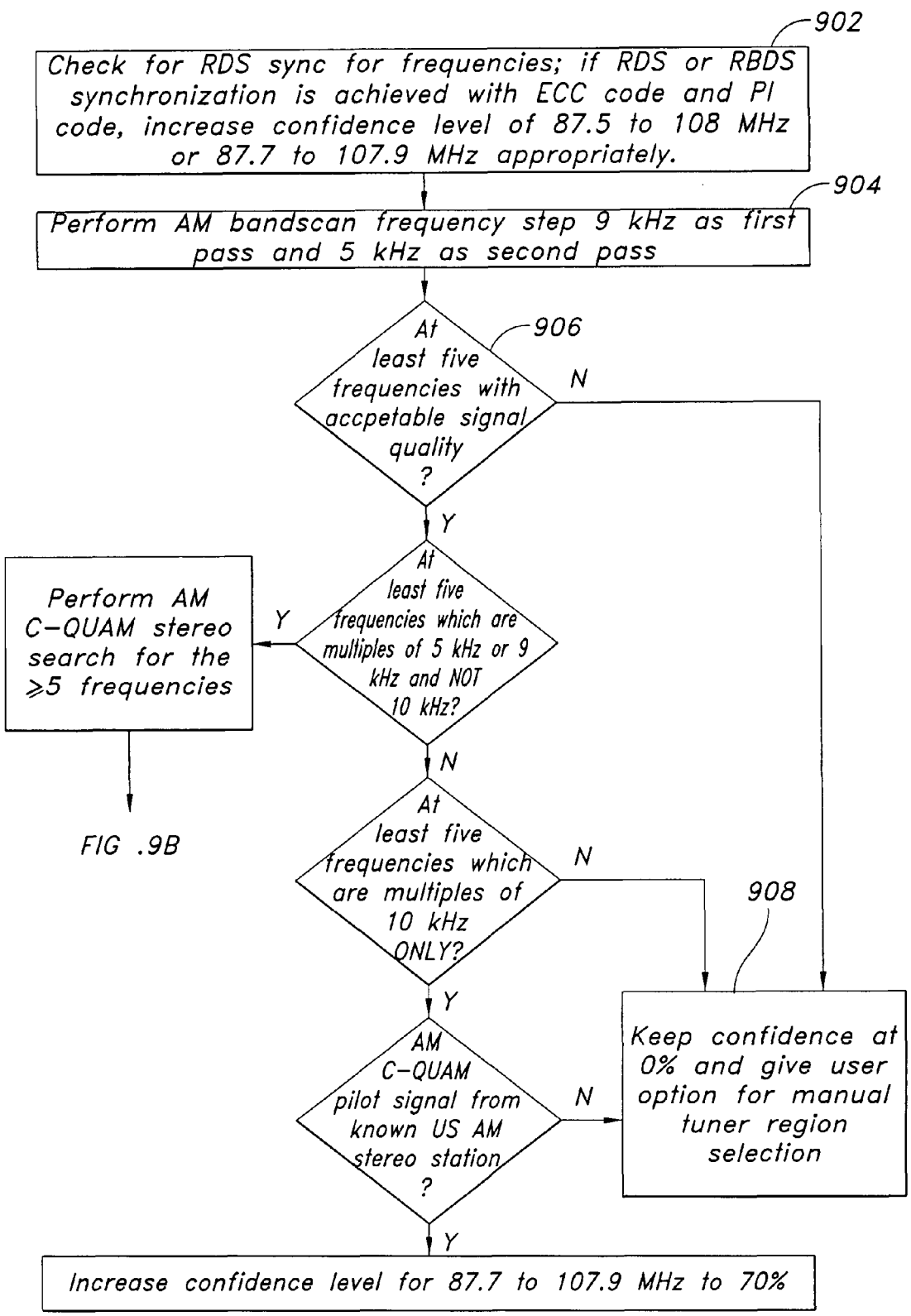
FIGS. 9a and 9b are a flow chart illustrating the selection of operational FM frequencies for a tuner when less than eleven scanned frequencies have a signal quality metric exceeding a threshold value according to one embodiment of the present invention.
Figure 9B:
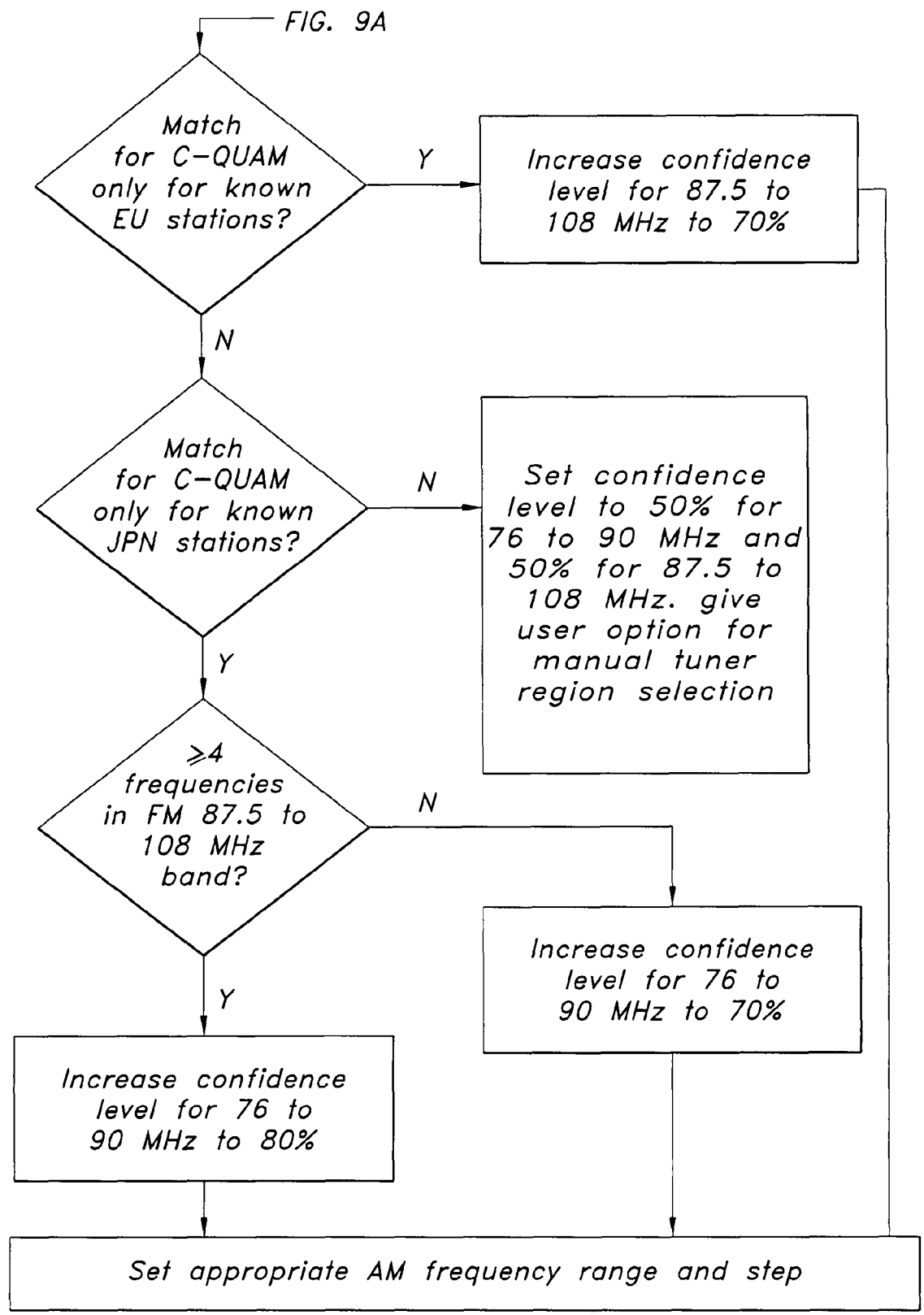

If it is determined in step 704 that there are less than eleven frequencies having the threshold quality, then operation continues with step 902 in FIG. 9a. To account for cases of high multipath conditions, an RDS and RBDS synchronization check is performed as a last measure. If RDS or RBDS synchronization is received, then the appropriate FM frequency band confidence level is increased.

Now that there is at least 80% confidence in the FM frequency range, bandscan in the AM Frequency band is performed (step 904). The bandscan may include a two-pass scan, the first being with frequency step of 5 kHz starting from 530 to 1602 kHz while the second pass scan involves 9 kHz frequency step across the 531 to 1602 kHz range. The frequencies in both scans may be sorted and the five strongest signals may be identified.

If the five strongest AM stations of the second pass are multiples of 9 kHz, then increase the confidence level of FM range 87.5 to 108 MHz to 90%. The confidence level of AM range 531 to 1602 kHz with frequency step of 5 kHz is set at 70%. If the five strongest AM stations are multiples of 5 kHz and NOT 10 kHz then the confidence level of FM range 87.5 to 108 MHz may be decreased to 50%. The confidence level of AM range 531 to 1602 kHz with frequency step of 5 kHz may be set at 50%.

If the five strongest AM stations are multiples of 10 kHz and 5 kHz, then a check for AM C-QUAM stereo stations known for the U.S. region may be performed. If there is a match, then the FM frequency range 87.7 to 107.9 MHz confidence level may be increased to 50%, the FM frequency range 87.5 to 108 MHz confidence level may be decreased to 50%, and the confidence level for AM frequency range of 530 kHz to 1602 kHz with frequency step of 10 kHz may be set at 50%. If five stations of acceptable signal quality are not found in step 906, then the confidence level is kept the same and the user is allowed to manually select the tuner region (step 908).

The method of the present invention may be implemented in different configurations based on the number of tuners available on the radio system. FIG. 10 illustrates some possible configurations along with merits that accompany each configuration option.

On a dual tuner radio, the bandscan may be performed much faster than on a single tuner configuration. A reason for this is that on a dual tuner radio, the main tuner may start the bandscan from the lower frequency end and work its way up the frequency range while the subtuner may start the bandscan process from the higher frequency end and work its way down the range, thereby completing the entire bandscan in half the time. Conversely, the single tuner configuration must scan the entire range using the main tuner. Another advantage of having a dual tuner system is that during the bandscan the audio of the currently listened to frequency that is tuned by the main tuner can remain unmuted. In the case of the single tuner configuration, in contrast, the audio may be muted in order for the bandscan to proceed because the main tuner performs the bandscan.

The recognition algorithm may utilize information gathered during the bandscan in order to determine whether the region signature is present and to give the end user an option of accepting the newly ascertained tuner region or staying put with the original factory-administered tuner region settings. The option may be presented to the user as choices highlighted with the confidence level with which the radio has determined the tuner region in which the car radio is presently disposed.

Figure 11A:
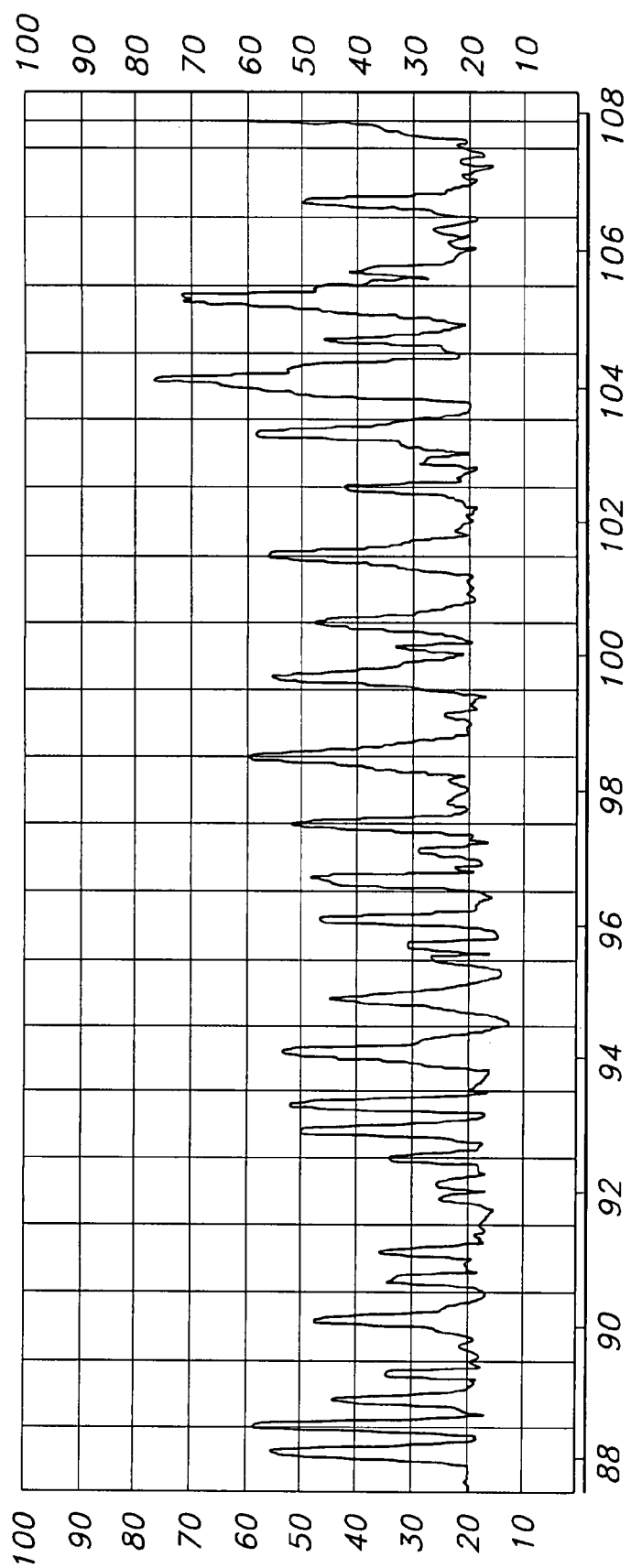
FIG. 11a is an exemplary plot of field strength versus FM frequency as measured in a scan of FM frequencies in one embodiment of a method of the present invention.
Figure 11B:
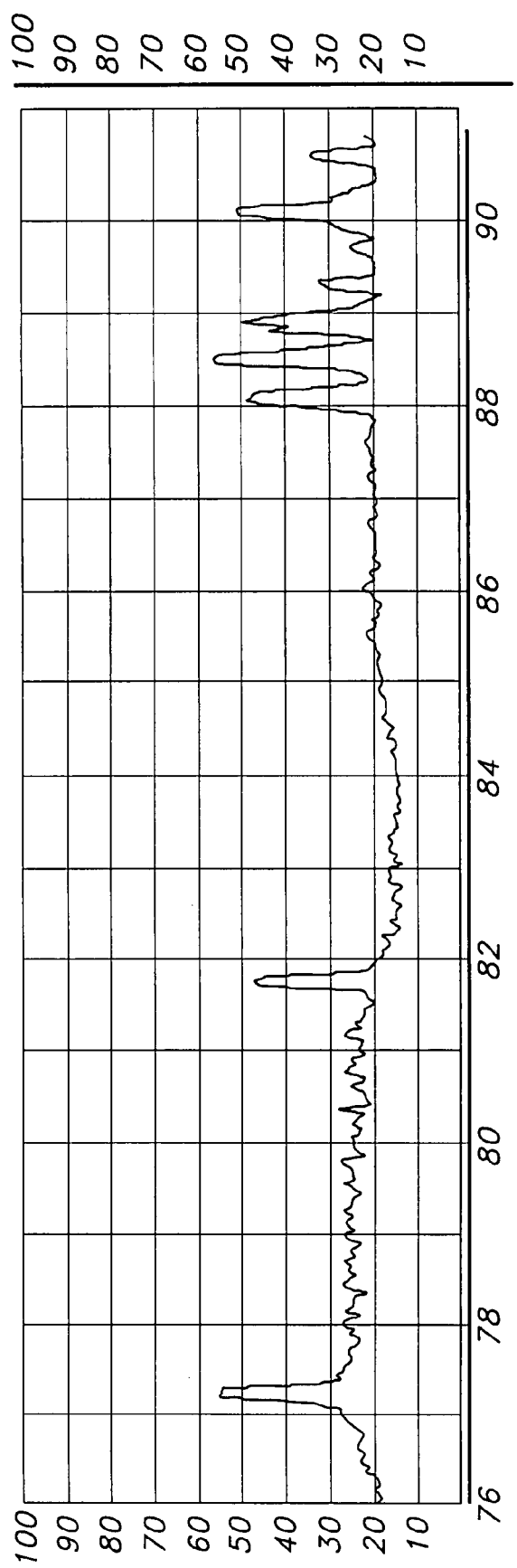
FIG. 11b is another exemplary plot of field strength versus FM frequency as measured in a scan of FM frequencies in one embodiment of a method of the present invention.
Figure 11C:
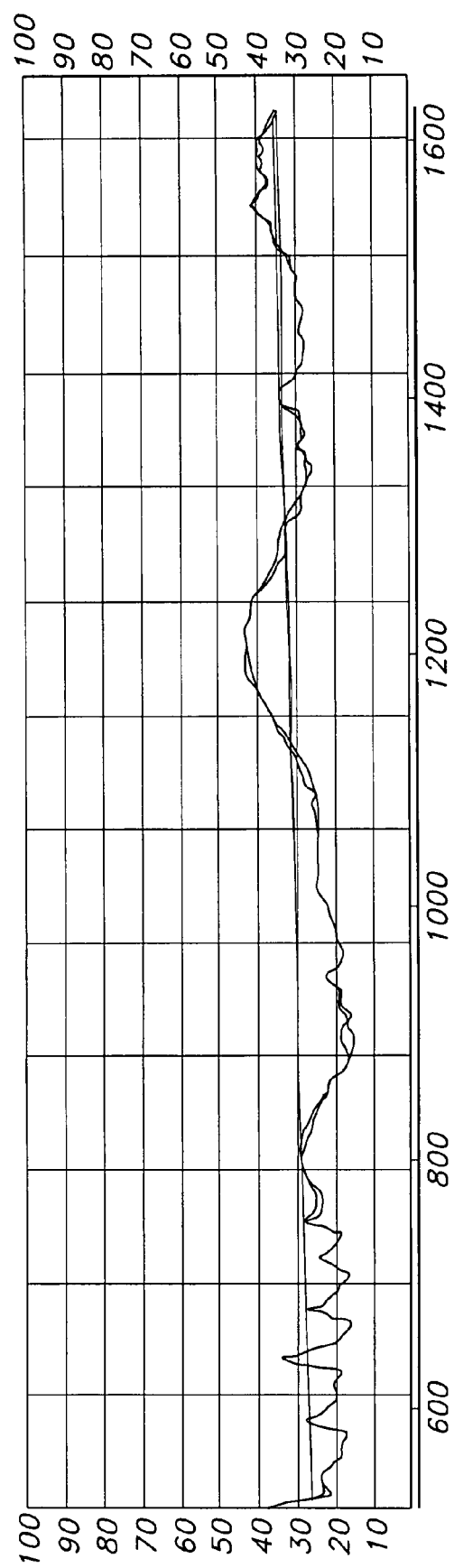
FIG. 11c is an exemplary plot of field strength versus AM frequency as measured in a scan of AM frequencies in one embodiment of a method of the present invention.

FIGS. 11a-c are plots of field strength versus frequency, wherein the x-axis represents frequency, and the y-axis represents field strength in dB micro volts, for bandscans taken at the Panasonic Software Design Center in Peachtree City, Ga. In particular, FIG. 11a corresponds to an FM bandscan with 100 kHz frequency step, in the range of 87.5 to 108 MHz; FIG. 11b corresponds to an FM bandscan with 100 kHz frequency step, in the range of 76 to 90 MHz; and FIG. 11c corresponds to an AM bandscan in the range of 530 to 1602 kHz.

In FIGS. 11a-b it can be seen that there are strong signals at odd frequencies, which could imply that the radio is in either the U.S. or the EU/RoW tuner region. However, during second pass scan, RDBS synchronization is detected on frequency 104.1 MHz (with PS Name: KISS FM) and 105.3 MHz (with PS Name: BUZZ) which raises the confidence level to 100% that the radio is in the U.S. tuner region.

During the AM bandscan of FIG. 11c, it is determined that the frequencies having strong signals are multiples of 10 kHz and 5 kHz. Because there is no available AM C-QUAM station in the vicinity, the algorithm sets the frequency range to 530 to 1602 kHz with frequency step at 5 kHz to maximize listening stations that can be captured.

Figure 12:
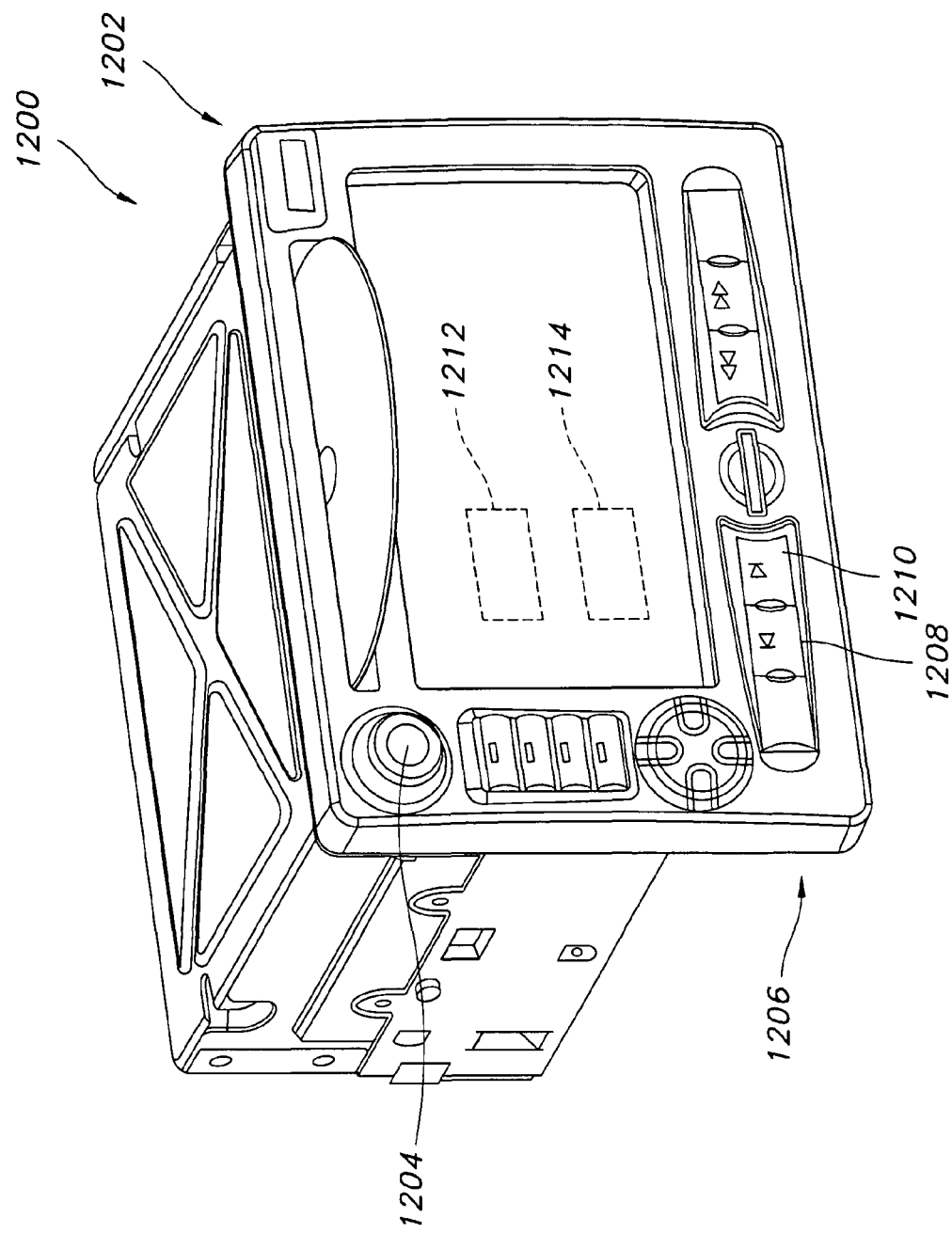
FIG. 12 is a perspective view of a radio that is suitable for use in one embodiment of a method of the present invention.

In addition to configuring the radio for the appropriate tuner region, it may also be desirable to reconfigure the user interface controls of the radio to suit the conventions of the particular tuner region. FIG. 12 illustrates a car radio 1200 including a user interface 1202 having user controls in the form of a knob or dial 1204, a set 1206 of pushbuttons, and a microphone (not shown) for receiving spoken commands. The desired functions associated with knob 1204, set 1206 of pushbuttons, and the spoken commands may depend upon the tuner region in which radio 1200 is disposed. Stored within a memory 1212 of radio 1200 may be a state table matrix that defines the functions of each of the controls on user interface 1202. Radio 1200 may include a tuner 1214.

The state table matrix may provide a mapping of input triggers (e.g., user controls) to the resulting end event or function based upon the current state of the embedded system. A blank example of a state matrix is shown in FIG. 13. Listed in the vertical column on the left are various user controls. Listed in the horizontal row across the top are various functions that may correspond to the user controls.

A different state table matrix may be required per region as there may be a different desired end operation for a common input trigger, such as a press of a pushbutton. For example, the U.S. tuner region supports the Radio Broadcasting Data System (RBDS) which requires support for the Program Service Name. Thus, the tune and seek operations for the U.S. tuner region may be different from the tune and seek operations for the European tuner region. Specifically, the operations or functions of Seek reverse pushbutton 1208 and Seek forward pushbutton 1210 may be different between the U.S. and European tuner regions.

The European tuner region supports Radio Data System (RDS), and thus the Tune and Seek operations may involve Memory Seek and Station List Tune. While the basic operation differences may be due to different underlying data systems across tuner regions, another difference in operation can arise when certain user controls on the user interface can trigger different operations as defined by the OEM customer.

Figure 14:
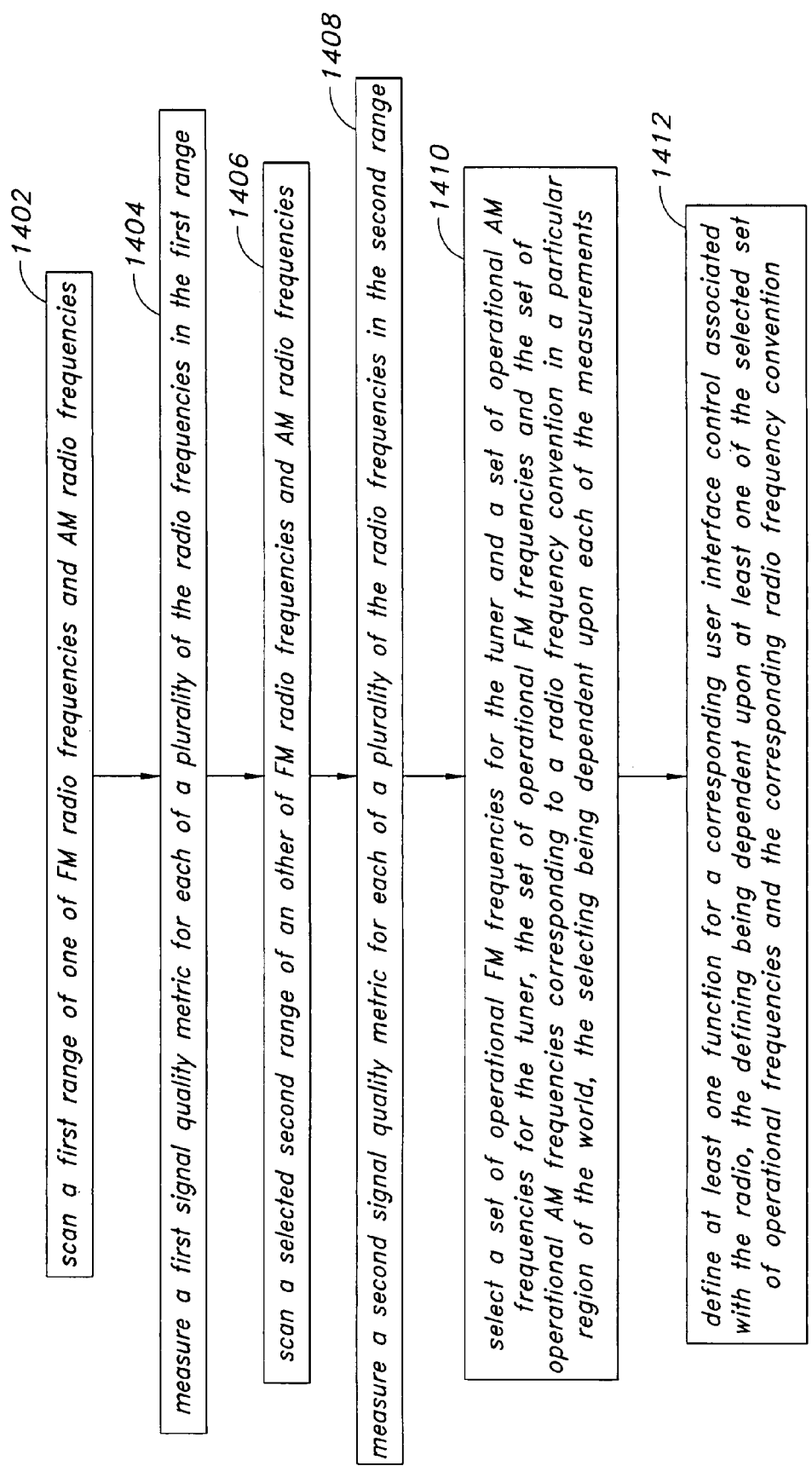
FIG. 14 is a flow chart of one embodiment of a method of the present invention for configuring a radio.

One embodiment of a method 1400 of the present invention of configuring a radio is illustrated in FIG. 14. In a first step 1402, a first range of FM radio frequencies or AM radio frequencies is scanned. For example, in one embodiment, FM radio frequencies from 87.5 to 108.0 MHz are scanned. In step 1404, a first signal quality metric is measured for each of a plurality of the radio frequencies in the first range. As an example, a signal quality metric in the form of a quality scale may be formulated for each frequency, wherein the quality scale is dependent upon the parameters of field strength, multipath, and ultrasonic noise. Next, in step 1406, a selected second range of the other of the FM radio frequencies and AM radio frequencies is scanned. That is, because the FM radio frequencies have already been scanned, the AM frequencies can be scanned next. In step 1408, a second signal quality metric is measured for each of a plurality of the radio frequencies in the second range. In a specific example, a signal quality metric in the form of a quality scale may be formulated for each frequency, wherein the quality scale is dependent upon the parameters of field strength, multipath, and cochannel interference noise.

In step 1410, a set of operational FM frequencies and a set of operational AM frequencies are selected for the tuner. The set of operational FM frequencies and the set of operational AM frequencies correspond to a radio frequency convention in a particular region of the world. The selection of the operational FM and AM frequencies is dependent upon each of the measurements. For example, a set of operational FM frequencies including the frequencies in the range of 87.7 to 107.9 MHz, and a set of operational AM frequencies including the frequencies in the range of 530 to 1710 kHz may be selected for the tuner. The sets of operational frequencies may be "selected" in the sense that the radio determines that the sets of operational frequencies are the sets that most likely correspond to the conventions of the tuner region in which the radio is currently disposed. That is, these particular selected sets of operational frequencies correspond to the radio frequency convention in the U.S. tuner region. Because the selected set of FM frequencies and the selected set of AM frequencies may correspond to the same tuner region for the sake of consistency, the selection of both sets of frequencies may depend upon the measurements made in both the FM band and the AM band. The signal quality measurements may correspond to the signature traits of a particular tuner region of the world, and the sets of FM and AM frequencies may be selected in correspondence with the particular tuner region.

In a final step 1412, at least one function is defined for a corresponding user interface control associated with the radio. The defining of the function is dependent upon the selected set of operational frequencies and/or the corresponding radio frequency convention. For example, as discussed above with reference to FIGS. 12 and 13, the definition of the function of Seek pushbuttons 1208, 1210 may depend upon the particular state table matrix that a processor of the radio is currently utilizing. Which of a number of state table matrices that is selected to currently be in use may depend upon the set of operational AM and FM frequencies that have been selected and/or the radio frequency convention that corresponds to the chosen state table matrix and to the selected sets of operational frequencies.

The present invention has been described herein as applying mainly to a radio that is installed in a vehicle, such as an automobile. However, it is to be understood that the invention also applies to any other type or installation of radio.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of configuring a tuner, comprising the steps of:
scanning at least one range of radio frequencies;
measuring a signal quality metric for each of a plurality of the frequencies; and
selecting a set of operational frequencies for the tuner, the set of operational frequencies corresponding to a radio frequency convention in a particular region of the world, said selecting being dependent upon the measuring step, the selecting step including the substeps of:
determining in which particular region of the world the tuner is most likely disposed, the set of selected operational frequencies corresponding to the particular region of the world in which the tuner is most likely disposed;
informing a user of which particular region of the world the tuner is most likely disposed; and
enabling the user to select another set of operational frequencies and thereby override the set of operational frequencies selected in correspondence with the particular region of the world in which the tuner is most likely disposed.

2. The method of claim 1 wherein the at least one range of radio frequencies includes a range of FM radio frequencies and a range of AM radio frequencies.

3. The method of claim 1 wherein the signal quality metric is dependent upon at least one of field strength, level of multipath, ultrasonic noise, and cochannel interference.

4. The method of claim 1 wherein one of a range of FM radio frequencies and a range of AM radio frequencies is scanned, the signal quality metric is measured for the scanned frequencies, and a range of frequencies in an other of the FM radio frequencies and AM radio frequencies is selected dependent upon the measured signal quality metric.

5. The method of claim 1 wherein the selecting step includes selecting a set of operational frequencies to maximize a number of broadcast stations from which the tuner may receive signals of an acceptable quality.

6. The method of claim 1 comprising the further step, after the measuring step and before the selecting step, of performing an RDS/RBDS synchronization check on each of the frequencies that have a measured signal quality metric exceeding a threshold value, the selecting step being dependent upon the performing step.

7. The method of claim 1 comprising the further step, after the measuring step and before the selecting step, of performing a check for AM C-QUAM on each of the frequencies that have a measured signal quality metric exceeding a threshold value, the selecting step being dependent upon the performing step.

8. A method of configuring a tuner, comprising the steps of:
scanning a first range of one of FM radio frequencies and AM radio frequencies;
measuring a first signal quality metric for each of a plurality of the radio frequencies in the first range;
scanning a selected second range of an other of FM radio frequencies and AM radio frequencies;
measuring a second signal quality metric for each of a plurality of the radio frequencies in the second range;

performing an RDS/RBDS synchronization check on each of the frequencies that have a measured signal quality metric exceeding a threshold value, the performing step being performed after at least one of the measuring steps; and selecting a set of operational FM frequencies for the tuner and a set of operational AM frequencies for the tuner, the set of operational FM frequencies and the set of operational AM frequencies corresponding to a radio frequency convention in a particular region of the world, the selecting being dependent upon each of the measuring steps and upon the performing step.

9. The method of claim 8 wherein the signal quality metric is dependent upon at least one of field strength, level of multipath, and ultrasonic noise for the FM radio frequencies, and the signal quality metric is dependent upon at least one of field strength, level of multipath, and cochannel interference for the AM radio frequencies.

10. The method of claim 8 wherein the selecting step includes determining in which particular region of the world the tuner is most likely disposed, the sets of selected operational frequencies corresponding to the particular region of the world in which the tuner is most likely disposed.

11. The method of claim 10 wherein the selecting step includes the substeps of:
informing the user of which particular region of the world the tuner is most likely disposed; and
enabling the user to select other sets of AM and FM operational frequencies and thereby override the sets of operational frequencies selected in correspondence with the particular region of the world in which the tuner is most likely disposed.

12. The method of claim 8 wherein the selecting step includes selecting sets of operational frequencies to maximize a number of broadcast stations from which the tuner may receive signals of an acceptable quality.

13. The method of claim 8, wherein the step of scanning a first range comprises scanning a first range of AM radio frequencies, the scanning of the first range of AM radio frequencies including performing a first scan with a frequency step of 5 kHz and performing a second scan with a frequency step of 9 kHz.

14. The method of claim 13, wherein the selecting step is dependent upon whether a group of the AM radio frequencies having best first signal quality metrics are multiples of 5 kHz or multiples of 9 kHz.

15. A method of configuring a radio, comprising the steps of:
scanning at least one range of radio frequencies;
measuring a signal quality metric for each of a plurality of the frequencies;
selecting a set of operational frequencies for a tuner of the radio, the set of operational frequencies corresponding to a radio frequency convention in a particular region of the world, the selecting being dependent upon the measuring step; and
defining at least one function for a corresponding user interface control associated with the radio, the defining being dependent upon at least one of the selected set of operational frequencies and the corresponding radio frequency convention.

16. The method of claim 15 wherein the user interface control comprises one of a pushbutton, a knob, and a command spoken by a user.

17. The method of claim 15 wherein the defining step includes loading into a memory of the radio a state matrix table corresponding to the selected set of operational frequencies.

18. The method of claim 15 wherein the selecting step includes selecting a set of operational frequencies to maximize a number of broadcast stations from which the tuner may receive signals of an acceptable quality.

19. The method of claim 15 comprising the further step, after the measuring step and before the selecting step, of performing an RDS/RBDS synchronization check on each of the frequencies that have a measured signal quality metric exceeding a threshold value, the selecting step and the defining step being dependent upon the performing step.

20. The method of claim 15, comprising the further step of enabling the user to select another set of operational frequencies and thereby override the set of operational frequencies corresponding to a radio frequency convention in a particular region of the world.

* * * * *